United States Patent
Narukawa et al.

(10) Patent No.: US 11,476,115 B2
(45) Date of Patent: Oct. 18, 2022

(54) COMPOUND SEMICONDUCTOR SUBSTRATE COMPRISING A SIC LAYER

(71) Applicant: AIR WATER INC., Sapporo (JP)

(72) Inventors: Mitsuhisa Narukawa, Matsumoto (JP); Hiroki Suzuki, Matsumoto (JP); Sumito Ouchi, Matsumoto (JP)

(73) Assignee: Air Water Inc., Sapporo (JP)

( * ) Notice: Subject to any disclaimer, the term of this patent is extended or adjusted under 35 U.S.C. 154(b) by 60 days.

(21) Appl. No.: 16/461,173

(22) PCT Filed: Nov. 10, 2017

(86) PCT No.: PCT/JP2017/040572
§ 371 (c)(1),
(2) Date: May 15, 2019

(87) PCT Pub. No.: WO2018/092689
PCT Pub. Date: May 24, 2018

(65) Prior Publication Data
US 2019/0279864 A1    Sep. 12, 2019

(30) Foreign Application Priority Data

Nov. 18, 2016  (JP) .............................. JP2016-225198

(51) Int. Cl.
*H01L 21/02*  (2006.01)
*C23C 16/34*  (2006.01)
(Continued)

(52) U.S. Cl.
CPC .......... *H01L 21/0254* (2013.01); *C23C 16/34* (2013.01); *C30B 25/18* (2013.01);
(Continued)

(58) Field of Classification Search
CPC ................................................. H01L 21/0254
(Continued)

(56) References Cited

U.S. PATENT DOCUMENTS

2006/0261370 A1   11/2006   Hoke et al.
2010/0084687 A1    4/2010   Chen et al.
(Continued)

FOREIGN PATENT DOCUMENTS

EP    3 270 409 A1    1/2018
JP    08-031419 B     3/1996
(Continued)

OTHER PUBLICATIONS

International Search Report, dated Jan. 23, 2018, in International Application No. PCT/JP2017/040572.
(Continued)

*Primary Examiner* — Ajay Arora
(74) *Attorney, Agent, or Firm* — Wood, Phillips, Katz, Clark & Mortimer

(57) ABSTRACT

A method for manufacturing a compound semiconductor substrate comprises: a step to form an SiC (silicon carbide) layer on a Si (silicon) substrate, a step to form a LT (Low Temperature)-AlN (aluminum nitride) layer with a thickness of 12 nanometers or more and 100 nanometers or less on the SiC layer at 700 degrees Celsius or more and 1000 degrees Celsius or less, a step to form a HT (High Temperature)-AlN layer on the LT-AlN layer at a temperature higher than the temperature at which the LT-AlN layer was formed, a step to form an Al (aluminum) nitride semiconductor layer on the HT-AlN layer, a step to form a GaN (gallium nitride) layer on the Al nitride semiconductor layer, and a step to form an Al nitride semiconductor layer on the GaN layer.

4 Claims, 9 Drawing Sheets

(51) Int. Cl.
*C30B 25/18* (2006.01)
*C30B 29/38* (2006.01)
*H01L 29/16* (2006.01)
*H01L 29/20* (2006.01)
*H01L 29/205* (2006.01)
*H01L 29/267* (2006.01)
*H01L 29/778* (2006.01)
*H01L 29/812* (2006.01)

(52) U.S. Cl.
CPC .......... *C30B 29/38* (2013.01); *H01L 21/0262* (2013.01); *H01L 21/02381* (2013.01); *H01L 21/02447* (2013.01); *H01L 21/02458* (2013.01); *H01L 21/02505* (2013.01); *H01L 21/02529* (2013.01); *H01L 29/1608* (2013.01); *H01L 29/2003* (2013.01); *H01L 29/205* (2013.01); *H01L 29/267* (2013.01); *H01L 29/778* (2013.01); *H01L 29/812* (2013.01); *H01L 29/7786* (2013.01)

(58) Field of Classification Search
USPC ............................................ 438/105; 257/77
See application file for complete search history.

(56) References Cited

U.S. PATENT DOCUMENTS

| | | |
|---|---|---|
| 2013/0062612 A1 | 3/2013 | Shioda et al. |
| 2014/0191240 A1 | 7/2014 | Chiang et al. |
| 2015/0111369 A1 | 4/2015 | Kim et al. |
| 2015/0236121 A1* | 8/2015 | Chiu ................ H01L 21/02505 257/194 |
| 2015/0357451 A1 | 12/2015 | Manippady et al. |
| 2016/0225887 A1* | 8/2016 | Gallagher ......... H01L 21/02458 |
| 2016/0293710 A1 | 10/2016 | Omori et al. |
| 2016/0322225 A1 | 11/2016 | Chen et al. |
| 2017/0069721 A1* | 3/2017 | Linthicum ........ H01L 21/02381 |
| 2018/0053647 A1* | 2/2018 | Fukazawa ......... H01L 21/02458 |

FOREIGN PATENT DOCUMENTS

| | | |
|---|---|---|
| JP | 10-75018 A | 3/1998 |
| JP | 2013-008938 A | 1/2013 |
| JP | 2013-070013 A | 4/2013 |
| JP | 2013-179121 A | 9/2013 |
| JP | 2013-201398 | 10/2013 |
| JP | 2013-201398 A | 10/2013 |
| JP | 2015-082662 A | 4/2015 |
| JP | 2016-195241 A | 11/2016 |
| TW | 201025599 A | 7/2010 |
| WO | 2016/143381 A1 | 9/2016 |
| WO | 2017-069087 A1 | 4/2017 |

OTHER PUBLICATIONS

International Preliminary Report on Patentability, dated May 21, 2019 in International Patent Application No. PCT/ JP2017/040572.
Supplementary European Search Report, dated Aug. 14, 2019 in European Patent Application No. EP 17 87 2493.
Kukushkin, S. A. et al., "Theory and practice of SiC growth on Si and its applications to wide-gap semiconductor films", Journal of Physics D: Applied Physics, Jul. 8, 2014, vol. 47, No. 31, p. 313001, Institute of Physics Publishing Ltd., Great Britain.
Office Action dated Dec. 8, 2020 in Japanese Patent Application No. 2016/225198.
Office Action dated Jul. 22, 2021 in Korean Patent Application No. 10-2019-7017331.
Office Action and Search Report, dated Mar. 24, 2021 in Taiwan Application No. 106139616.
Office Action dated Jul. 23, 2021 in Taiwan Patent Application No. 106139616.
Office Action dated Jan. 3, 2022 in European Patent Application No. 17 872 493.6.

* cited by examiner

FIG. 4

| SAMPLE | SAMPLE 1 | SAMPLE 2 | SAMPLE 3 | SAMPLE 4 | SAMPLE 5 | SAMPLE 6 |
|---|---|---|---|---|---|---|
| SUBSTRATE | Si | SiC/Si | Si | SiC/Si | Si | SiC/Si |
| LT-AlN LAYER FORMING TEMPERATURE | 1100°C | 1100°C | 1000°C | 1000°C | 800°C | 800°C |
| VERTICAL WITHSTAND VOLTAGE (Current density: 1A/cm$^2$) | 642V | 501V | 650V | 709V | Could not create | 763V |
| REMARKS | Comparative example | Comparative example | Comparative example | Example of the invention | Comparative example | Example of the invention |

FIG. 6

| SAMPLE | SAMPLE 11 | SAMPLE 12 | SAMPLE 13 | SAMPLE 14 | SAMPLE 15 |
|---|---|---|---|---|---|
| SUBSTRATE | SiC/Si | | | | |
| LT-AlN LAYER FORMING TEMPERATURE | 900°C | 850°C | 800°C | 750°C | 700°C |
| VERTICAL WITHSTAND VOLTAGE (Current density: $1 \times 10^{-4}$ A/cm$^2$) | 371V | 399V | 450V | 317V | 24V |
| REMARKS | Example of the invention | Example of the invention | Example of the invention | Example of the invention | Example of the invention |

FIG. 7

| SAMPLE | SAMPLE 21 | SAMPLE 22 | SAMPLE 23 | SAMPLE 24 | SAMPLE 25 |
|---|---|---|---|---|---|
| SUBSTRATE | SiC/Si | SiC/Si | Si | SiC/Si | Si |
| LT-AlN LAYER FORMING TEMPERATURE | 800°C | 1100°C | 1100°C | 1100°C | 1100°C |
| Average concentration of carbon in C-GaN layer | $1 \times 10^{19}$ atm/cm$^3$ | $1 \times 10^{19}$ atm/cm$^3$ | $1 \times 10^{19}$ atm/cm$^3$ | $1 \times 10^{18}$ atm/cm$^3$ | $1 \times 10^{18}$ atm/cm$^3$ |
| REMARKS | Example of the invention | Comparative example | Comparative example | Comparative example | Comparative example |

COMPOUND SEMICONDUCTOR SUBSTRATE COMPRISING A SIC LAYER

TECHNOLOGICAL FIELD

The present invention relates to a method for manufacturing a compound semiconductor substrate and a compound semiconductor substrate. More specifically, it relates to a compound semiconductor substrate with a SiC (silicon carbide) layer.

DESCRIPTION OF THE RELATED ART

GaN (gallium nitride) is known as a wide band gap semiconductor material with a larger band gap and a higher isolation breakdown field strength as compared to Si (silicon). GaN is more resistant to isolation breakdown than other wide band gap semiconductor materials, and is expected to be applied to next-generation low-loss power devices.

When a Si substrate is used for the start substrate (foundation substrate) of a semiconductor device using GaN, the phenomenon in which warpage occurs on the substrate or cracks occur in the GaN layer tends to occur, due to the large differences of lattice constants and thermal expansion coefficients between GaN and Si.

In the following Patent Documents 1 to 5 etc., as a countermeasure against the occurrence of warpage on the substrate and cracks in the GaN layer, a method is proposed in which a SiC (silicon carbide) layer or an AlN (aluminum nitride) layer is used as a buffer layer to form an GaN layer.

In the following Patent Document 1, a semiconductor substrate is disclosed. It comprises a Si substrate, a 3C-SiC layer formed on the Si substrate, and a plurality of AlN layers and GaN layers alternately formed. The film forming temperature of the AlN layer in the first step is 1000 to 1300 degrees Celsius which is higher than the film forming temperature of the GaN layer (900 to 1200 degrees Celsius). The formation temperature of the AlN layer in the second step is lower than the film forming temperature of the GaN layer and is 800 to 1200 degrees Celsius.

The following technology is disclosed in Patent Document 2 below. A buffer layer consisting of AlN is formed at a temperature of 1090 degrees Celsius on a principal surface of a semiconductor substrate consisting of SiC. A single-crystal layer consisting of AlGaInN (aluminum nitride gallium indium) is formed on the buffer layer at a temperature of 800 degrees Celsius.

The following technology is disclosed in Patent Document 3 below. A SiC layer is formed on a Si substrate. An AlN buffer layer is formed on the SiC layer at the substrate temperature of 600 degrees Celsius. A GaN layer is formed on the AlN buffer layer at the substrate temperature of 1040 degrees Celsius.

The following technology is disclosed in Patent Document 4 below. On a substrate consisting of Si or SiC, a buffer layer, a middle layer, an electron transition layer, and an electrons supply layer are formed in order. The buffer layer consists of an initial buffer layer in which an AlN layer and an $Al_zGa_{1-z}N$ ($0 \le z \le 1$) layers are stacked in this order, and a periodic deposition layer formed on the initial buffer layer.

Further, the following technology is disclosed in Patent Document 5 below. First and second nucleation layers consisting of AlN are formed on a silicon substrate. A buffer layer consisting of AlGaN is formed on the second nucleation layer. A GaN layer is formed on the buffer layer. An AlGaN layer is formed on the GaN layer. Each of the first and second nucleation layers is formed at the same film forming temperature and by different ratio of source gas.

PRIOR ART DOCUMENT

Document(s) Related to Patents

[Patent Document 1] Japanese Unexamined Patent Application Publication No. 2013-179121
[Patent Document 2] Japanese Unexamined Patent Application Publication No. Hei 10-75018 (Japanese Patent No. 2999435)
[Patent Document 3] Japanese Examined Patent Publication No. Hei 08-31419
[Patent Document 4] Japanese Unexamined Patent Application Publication No. 2013-08938 (Japanese Patent No. 5788296)
[Patent Document 5] Japanese Unexamined Patent Application Publication No. 2013-201398

SUMMARY OF THE INVENTION

Problems to be Resolved by the Invention

When using a GaN layer as a power device such as a HEMT (High Electron Mobility Transistor), high withstand voltage in the vertical direction (direction perpendicular to the principal surface of the GaN layer) is required for the GaN layer, and reduction of current collapse is also required. The current collapse is a phenomenon in which the on-resistance increases when electrons are trapped in defects near the channel when high voltage is applied to the electrodes of the device.

A method to improve the vertical withstand voltage of a GaN layer is to dope the GaN layer with C (carbon) etc. However, when the GaN is doped with C etc., defects increase in the GaN layer. Thereby, sites where electrons are trapped increase, and the current collapse degrades. Thus, according to the prior art, it is impossible to achieve both the improvement of the vertical withstand voltage of GaN and the reduction of current collapse, and it is not possible to obtain the desired quality.

The present invention is for solving the above-mentioned problems, and its object is to provide a method for manufacturing a compound semiconductor substrate and a compound semiconductor substrate having desired qualities.

SUMMARY OF THE INVENTION

According to one aspect of the invention, a method for manufacturing a compound semiconductor substrate comprises a step to form a SiC layer on a Si substrate, a step to form a first AlN layer having a thickness of 12 nanometers or more and 100 nanometers or less on the SiC layer at 700 degrees Celsius or more and 1000 degrees Celsius or less, a step to form a second AlN layer on the first AlN layer at a temperature higher than the temperature at which the first AlN layer was formed, a step to form a first nitride semiconductor layer containing Al on the second AlN layer, a step to form a GaN layer on the first nitride semiconductor layer, and a step to form a second nitride semiconductor layer containing Al on the GaN layer.

Preferably, in the above method for manufacturing, the first AlN layer is formed at a temperature of 800 degrees Celsius or more and 900 degrees Celsius or less, at the step to form the first AlN layer.

Preferably, in the above method for manufacturing, the second AlN layer is formed at a temperature of 1000 degrees Celsius or more and 1500 degrees Celsius or less, at the step to form the second AlN layer.

Preferably, in the above method for manufacturing, the second AlN layer is formed with a thickness of 50 nanometers or more and 1000 nanometers or less, at the step to form the second AlN layer.

According to another aspect of the invention, a compound semiconductor substrate comprises a Si substrate, a SiC layer, formed on the Si substrate, an AlN layer, formed on the SiC layer, a first nitride semiconductor layer including Al, formed on the AlN layer, a GaN layer, formed on the first nitride semiconductor layer, and a second nitride semiconductor layer including Al, formed on the GaN layer, wherein time until a ratio of capacitance after application of voltage to capacitance before the application of the voltage recovers to 0.9 or more after the application of voltage was stopped is within time the voltage had been applied, when voltage of −30V had been applied for 60 seconds between a first electrode and a second electrode and the application of the voltage was stopped, wherein the first electrode is provided on the second nitride semiconductor layer and is in contact with the second nitride semiconductor layer, and the second electrode is provided on the second nitride semiconductor layer and is in contact with the second nitride semiconductor layer so as to surround the first electrode.

Effect of the Invention

According to the present invention, a method for manufacturing a compound semiconductor substrate and a compound semiconductor substrate having desired qualities can be provided.

BRIEF DESCRIPTION OF THE DRAWINGS

FIG. 4 shows a table showing the relationship between the preparation conditions of each of the samples 1 to 6 and the measured withstand voltage in the vertical direction, in the first embodiment of the present invention.

FIG. 6 shows a table showing the relationship between the preparation conditions of each of the samples 11 to 15 and the measured withstand voltage in the vertical direction, in the second embodiment of the present invention.

FIG. 7 shows a table showing preparation conditions of each of the samples 21 to 25 in the third embodiment of the present invention.

DETAILED DESCRIPTION OF EMBODIMENTS

[The Configuration of a Compound Semiconductor Substrate, and a Method for Manufacturing the Same]

Figure 1:
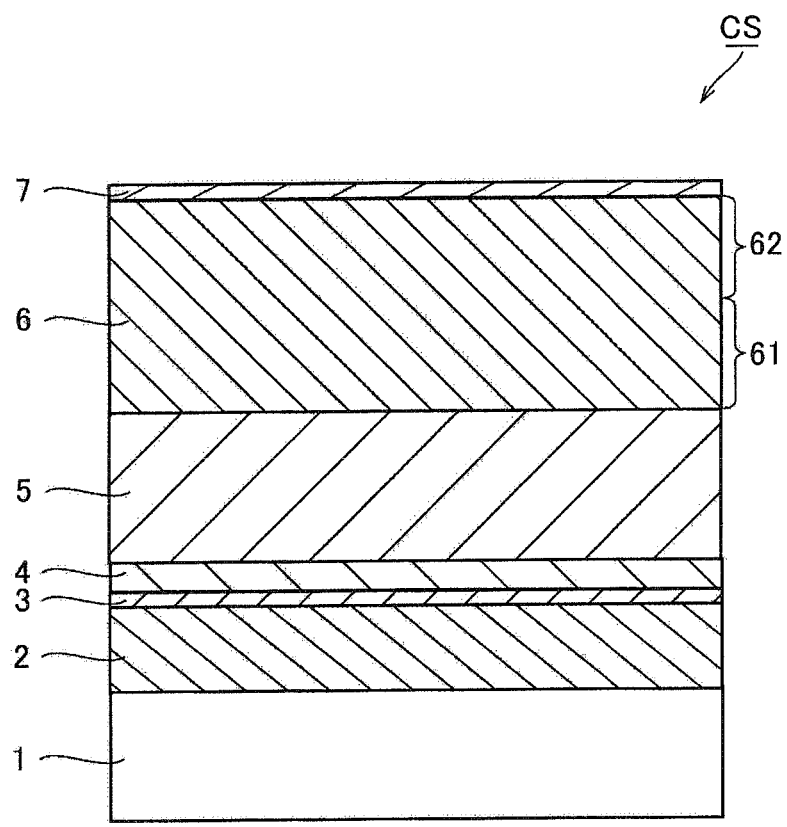
FIG. 1 shows a cross-sectional view showing a configuration of compound semiconductor substrate CS in an embodiment of the present invention.

FIG. 1 shows a cross-sectional view showing the configuration of compound semiconductor substrate CS in an embodiment of the present invention.

Referring to FIG. 1, the compound semiconductor substrate CS in the present embodiment includes a part of a HEMT. Compound semiconductor substrate CS has Si substrate 1, SiC layer 2, LT (Low Temperature)-AlN layer 3 (an example of a first AlN layer), HT (High Temperature)-AlN layer 4 (an example of a second AlN layer), Al (Aluminum) nitride semiconductor layer 5 (an example of a first nitride semiconductor layer), GaN layer 6, and Al nitride semiconductor layer 7 (an example of a second nitride semiconductor layer).

Si substrate 1 is made of, for example, p-type Si. On a surface of Si substrate 1, a (111) plane is exposed. Si substrate 1 may have a conductivity type of n-type or may be semi-insulating. The surface of Si substrate 1 may have the (100) plane or the (110) plane exposed. Si substrate 1 has, for example, a diameter of 2 to 8 inches and has a thickness of 250 micrometers to 1000 micrometers.

SiC layer 2 is in contact with Si substrate 1 and is formed on Si substrate 1. SiC layer 2 is made of 3C-SiC, 4H-SiC, 6H-SiC, or the like. In particular, when SiC layer 2 was epitaxially grown on Si substrate 1, generally, SiC layer 2 consists of 3C-SiC.

By using an MBE (Molecular Beam Epitaxy) method, a CVD (Chemical Vapor Deposition) method, an LPE (Liquid Phase Epitaxy) method or the like, SiC layer 2 may be formed by making SiC homo epitaxial growth on a foundation layer consisting of SiC obtained by carbonizing Si substrate 1 surface. SiC layer 2 may be formed only by carbonizing the surface of Si substrate 1. Furthermore, SiC layer 2 may be formed by hetero epitaxial growth on the surface (or with a buffer layer interposed) of Si substrate 1. For example, SiC layer 2 is doped with N (nitrogen) etc., and has a conductivity type of n-type. SiC layer 2 has a thickness of, for example, 0.1 micrometers or more and 3.5 micrometers or less. Note that SiC layer 2 may have a p-type conductivity type. SiC layer 2 may be semi-insulating.

LT-AlN layer 3 is in contact with SiC layer 2 and is formed on SiC layer 2. HT-AlN layer 4 is in contact with LT-AlN layer 3 and is formed on LT-AlN layer 3. LT-AlN layer 3 and HT-AlN layer 4 are made of, for example, a single-crystal of AlN. LT-AlN layer 3 and HT-AlN layer 4 act as buffer layers which mitigate the difference of the lattice constants between SiC layer 2 and Al nitride semiconductor layer 5. LT-AlN layer 3 and HT-AlN layer 4 are formed by using, for example, a MOCVD (Metal Organic Chemical Vapor Deposition) method. At this time, as Al source gas, for example, TMA (Tri Methyl Aluminum), TEA (Tri Ethyl Aluminum), etc. are used. As N source gas, for example, $NH_3$ (ammonia) is used. LT-AlN layer 3 has a thickness of 12 nanometers or more and 100 nanometers or less. By making the thickness of LT-AlN layer 3, 12 nanometers or more, a high vertical withstand voltage can be secured. By making the thickness of LT-AlN layer 3, 100 nanometers or less, the occurrence of warpage can be suppressed. The LT-AlN layer 3 preferably has a thickness of 15 nanometers or more and 60 nanometers or less, more preferably 20 nanometers or more and 50 nanometers or less. The HT-AlN layer 4 has a thickness of, for example, 50 nanometers or more and 1000 nanometers or less.

Al nitride semiconductor layer 5 is in contact with HT-AlN layer 4 and is formed on HT-AlN layer 4. Al nitride semiconductor layer 5 is made of nitride semiconductor containing Al, and is made of, for example, a material represented by $Al_xGa_{1-x}N$ (0<x≤1). Also, Al nitride semiconductor layer 5 may be made of a material represented by $Al_xIn_yGa_{1-x-y}N$ (0<x≤1, 0≤y<1). Al nitride semiconductor layer 5 functions as a buffer layer, which mitigates the difference of the lattice constants between HT-AlN layer 4 and GaN layer 6. Al nitride semiconductor layer 5 has a thickness of, for example, 500 nanometers or more and 3 micrometers or less. Al nitride semiconductor layer 5 is formed, for example, using an MOCVD method. Note that the concentration of Al may be changed depending on the depth direction of Al nitride semiconductor layer 5.

GaN layer 6 is in contact with Al nitride semiconductor layer 5 and is formed on Al nitride semiconductor layer 5. The GaN layer 6 has, for example, a thickness of 500 nanometers or more and 3 micrometers or less. GaN layer 6 becomes an electron transition layer of the HEMT. GaN layer 6 is formed, for example, using an MOCVD method. At this time, as Ga source gas, for example, TMG (Tri Methyl Gallium) or TEG (Tri Ethyl Gallium) is used. As N source gas, for example, $NH_3$ is used.

A part of the GaN layer 6 may be doped with impurity which reduces the conductivity, such as C. When C is used for doping, GaN layer 6 includes C-doped C-GaN layer 61 and C-undoped u (undoped)-GaN layer 62. C-GaN layer 61 is formed on the lower side (closer to Al nitride semiconductor layer 5) than u-GaN layer 62. The average concentration of C in C-GaN layer 61 when C is used for doping is, for example, $5*10^{18}$ atoms/cm$^3$ or more and $5*10^{19}$ atoms/cm$^3$ or less.

By doping with impurity into GaN layer 6 to improve insulation, the breakdown voltage of the vertical direction of compound semiconductor substrate CS (direction perpendicular to the surface of GaN layer 6, vertical direction in FIG. 1) is improved. Also, by making the part doped with impurity close to Al nitride semiconductor layer 5 in GaN layer 6, it is possible to suppress a situation in which defects increase in the part of GaN layer 6 where the channel is formed (the part close to Al nitride semiconductor layer 7). Also, degrades of current collapse caused by impurity doping can be suppressed.

Al nitride semiconductor layer 7 is in contact with GaN layer 6 and is formed on GaN layer 6. Al nitride semiconductor layer 7 is made of nitride semiconductor containing Al, and is made of, for example, a material represented by $Al_vGa_{1-v}N$ (0<v≤1). Further, Al nitride semiconductor layer 7 may be made of a material represented by $Al_vIn_wGa_{1-v-w}N$ (0<v≤1, 0≤w<1). Al nitride semiconductor layer 7 becomes a HEMT barrier layer. Al nitride semiconductor layer 7 has a thickness of, for example, 10 nanometers or more and 50 nanometers or less. Note that the concentration of Al may be changed depending on the depth direction of Al nitride semiconductor layer 7.

Compound semiconductor substrate CS is manufactured in the following manner. SiC layer 2 is formed on Si substrate 1. LT-AlN layer 3 is formed on SiC layer 2. HT-AlN layer 4 is formed on LT-AlN layer 3. Al nitride semiconductor layer 5 is formed on HT-AlN layer 4. GaN layer 6 is formed on Al nitride semiconductor layer 5. Al nitride semiconductor layer 7 is formed on GaN layer 6. HT-AlN layer 4 is formed at a temperature higher than the temperature at which LT-AlN layer 3 is formed (the film forming temperature). The temperature at which LT-AlN layer 3 is formed is 700 degrees Celsius or more and 1000 degrees Celsius or less, preferably 800 degrees Celsius or more and 900 degrees Celsius or less. The temperature at which HT-AlN layer 4 is formed is, for example, 1000 degrees Celsius or more and 1500 degrees Celsius or less.

Effect of the Embodiment

Figure 2:
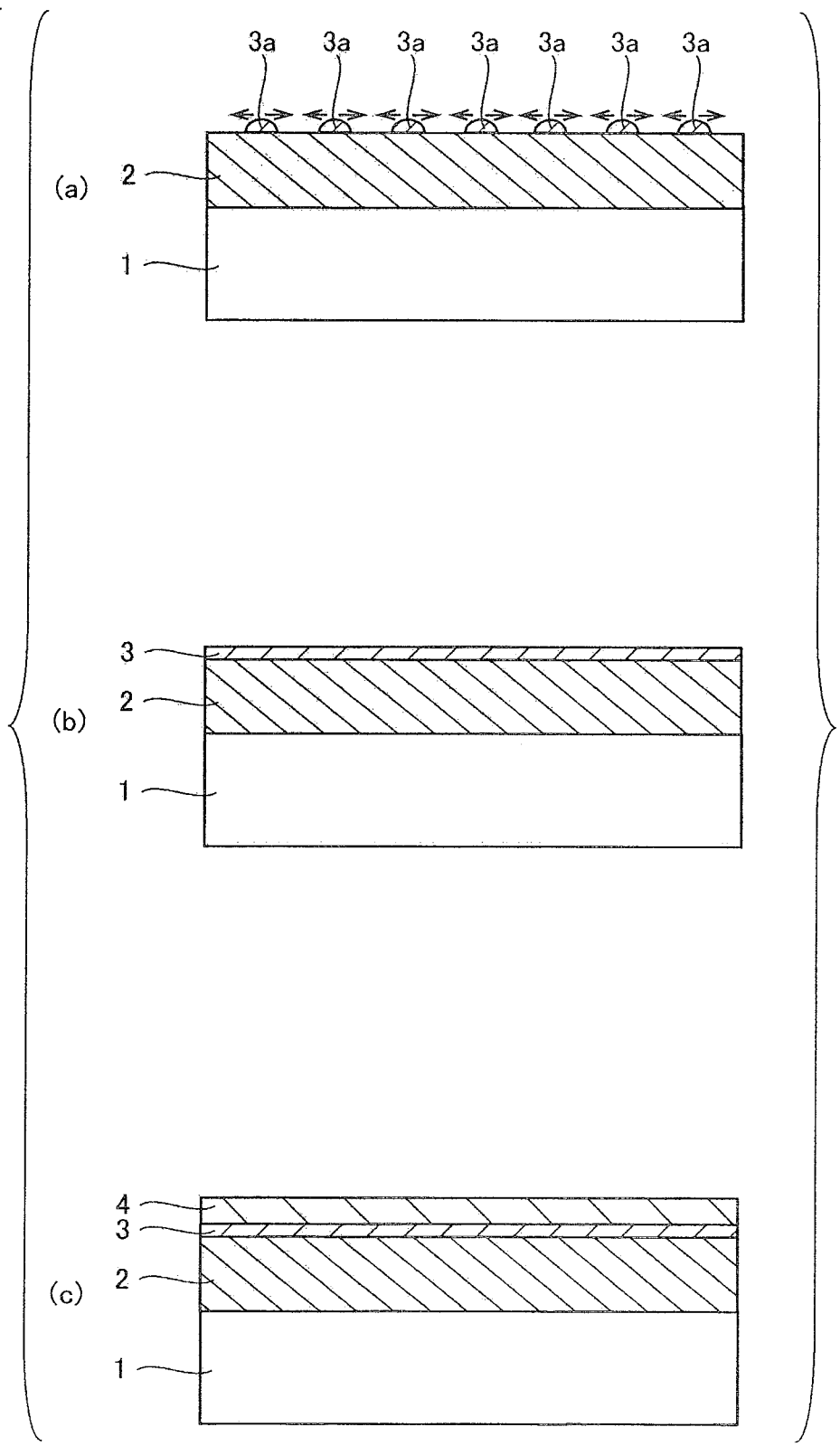
FIG. 2 shows a diagram for explaining the effect obtained in the embodiment of the present invention.

FIG. 2 is a diagram for explaining the effect obtained in the embodiment of the present invention.

Referring to FIG. 2 (a), LT-AlN layer 3 is formed at the film forming temperature lower than that of HT-AlN layer 4. By this, it is possible to increase the number of AlN nuclei 3a (nuclei density of an initial AlN layer) generated on SiC layer 2 when LT-AlN layer 3 is formed. As shown by the arrows, each of the nuclei 3a of AlN grows in a direction parallel to the surface of SiC layer 2 (lateral direction in FIG. 2 (a)), and the nuclei 3a are connected with each other. As a result, as shown in FIG. 2 (b), LT-AlN layer 3 is formed on SiC layer 2.

Generally, when an AlN layer is formed on a SiC layer, by making the film forming temperature of the AlN layer higher than 1000 degrees Celsius, the crystal property of the AlN layer can be improved. Since the film forming temperature of LT-AlN layer 3 is lower than the film forming temperature of general AlN layers, LT-AlN layer 3 contains a lot of defects and LT-AlN layer 3 has a bad crystal characteristic.

Referring to FIG. 2 (c), HT-AlN layer 4 is formed at the film forming temperature higher than that of LT-AlN layer 3. Since HT-AlN layer 4 is film-formed on LT-AlN layer 3 as a foundation, defects are reduced and the crystal characteristic is improved, as compared to LT-AlN layer 3. Also, since the crystal characteristic of HT-AlN layer 4 is improved, defects in Al nitride semiconductor layer 5, GaN layer 6, and Al nitride semiconductor layer 7 formed above HT-AlN layer 4 are also reduced, and the crystal character is improved.

Also, compound semiconductor substrate CS includes SiC layer 2 as a foundation layer of GaN layer 6. The lattice constant of SiC is closer to the lattice constant of GaN as compared with the lattice constant of Si. Since GaN layer 6 is formed on SiC layer 2, it can improve the crystalline nature of GaN layer 6.

The crystalline nature of GaN layer 6 has been improved. For this reason, even though impurity which improves insulation is doped into GaN layer 6, the sites where electrons are trapped in GaN layer 6 are fewer as compared to conventional GaN layers. As a result, current collapse can be reduced while improving withstand voltage in a vertical direction.

In addition, since the crystalline nature of HT-AlN layer 4 is improved, even if each of Al nitride semiconductor layer 5, GaN layer 6, and Al nitride semiconductor layer 7 formed above HT-AlN layer 4 is thickened, the crystalline nature can be kept good. As a result, the crystal characteristic is improved.

First Embodiment

The inventors of the present invention produced each of the samples 1 to 6 under different conditions, and the vertical withstand voltage of each of the samples 1 to 6 was measured.

Figure 3:
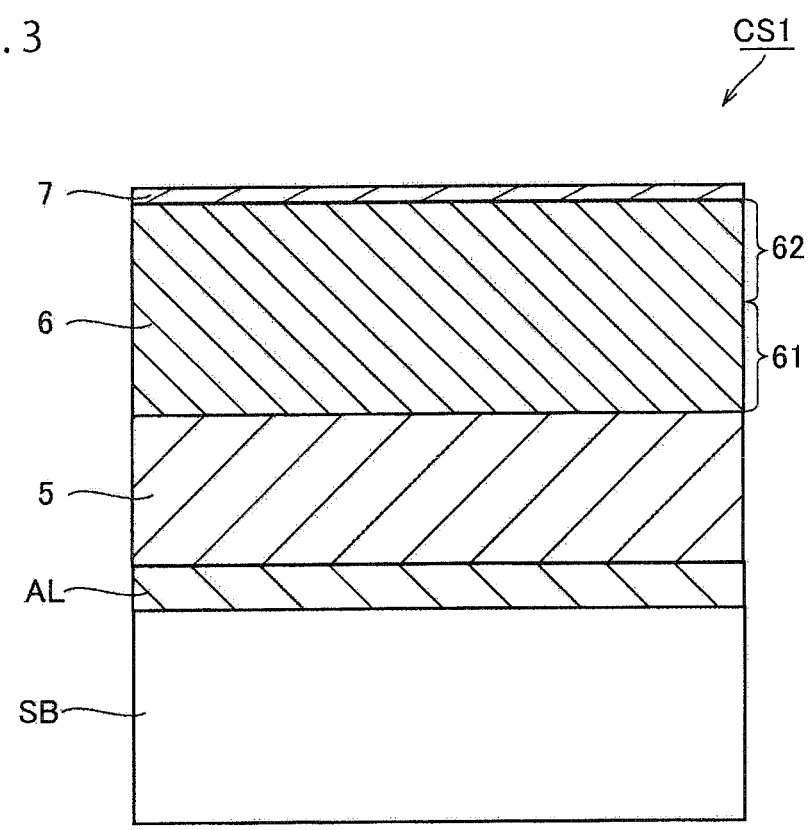
FIG. 3 shows a cross-sectional view showing the configuration of compound semiconductor substrate CS1 which is a configuration common to Samples 1 to 6 in the first embodiment of the present invention.

FIG. 3 is a cross-sectional view showing the configuration of compound semiconductor substrate CS1 which is a configuration common to samples 1 to 6 in the first embodiment of the present invention. FIG. 4 shows a table showing the relationship between the preparation conditions of each of the samples 1 to 6 and the measured withstand voltage in the vertical direction in the first embodiment of the present invention.

Referring to FIGS. 3 and 4, compound semiconductor substrate CS1 comprises substrate SB, AlN layer AL, Al nitride semiconductor layer 5, GaN layer 6, and Al nitride semiconductor layer 7. Each of AlN layer AL, Al nitride semiconductor layer 5, GaN layer 6, and Al nitride semiconductor layer 7 is formed by being stacked in this order on substrate SB.

The preparation conditions of each of the samples 1 to 6 are as follows.

Sample 1 (comparative example): In compound semiconductor substrate CS1, a Si substrate was used as substrate SB, and a SiC layer was not formed. As AlN layer AL, at the film forming temperature of 1100 degrees Celsius, a LT-AlN layer was formed on substrate SB. A HT-AlN layer was formed at the film forming temperature of 1200 degrees Celsius on the LT-AlN layer. The layers other than these were formed by the method described in the above embodiment.

Sample 2 (comparative example): In compound semiconductor substrate CS1, one having a SiC layer formed on a Si substrate was used as substrate SB. A LT-AlN layer was formed as AlN layer AL at the film forming temperature of 1100 degrees Celsius, on substrate SB. A HT-AlN layer was formed at the film forming temperature of 1200 degrees Celsius, on the LT-AlN layer. The layers other than these were formed by the method described in the above embodiment.

Sample 3 (comparative example): In compound semiconductor substrate CS1, a Si substrate was used as substrate SB, and a SiC layer was not formed. As AlN layer AL, at the film forming temperature of 1000 degrees Celsius, a LT-AlN layer was formed on substrate SB. A HT-AlN layer was formed at the film forming temperature of 1200 degrees Celsius on the LT-AlN layer. The layers other than these were formed by the method described in the above embodiment.

Sample 4 (example of the present invention): In compound semiconductor substrate CS1, one having a SiC layer formed on a Si substrate was used as substrate SB. A LT-AlN layer was formed as AlN layer AL at the film forming temperature of 1000 degrees Celsius, on substrate SB. A HT-AlN layer was formed at the film forming temperature of 1200 degrees Celsius, on the LT-AlN layer. The layers other than these were formed by the method described in the above embodiment.

Sample 5 (comparative example): In compound semiconductor substrate CS1, a Si substrate was used as substrate SB and a SiC layer was not formed. When an attempt was made to form an LT-AlN layer at the film forming temperature of 800 degrees Celsius as AlN layer AL on substrate SB, the temperature was too low and the LT-AlN layer did not grow. Therefore, compound semiconductor substrate CS1 could not be produced.

Sample 6 (example of the present invention): In compound semiconductor substrate CS1, one having a SiC layer formed on a Si substrate was used as substrate SB. A LT-AlN layer was formed as AlN layer AL at the film forming temperature of 800 degrees Celsius on substrate SB. A HT-AlN layer was formed at the film forming temperature of 1200 degrees Celsius, on the LT-AlN layer. The layers other than these were formed by the method described in the above embodiment.

The inventors of the present application measured the vertical withstand voltage of each of the prepared samples 1 to 4 and sample 6 by the following method.

Figure 5:
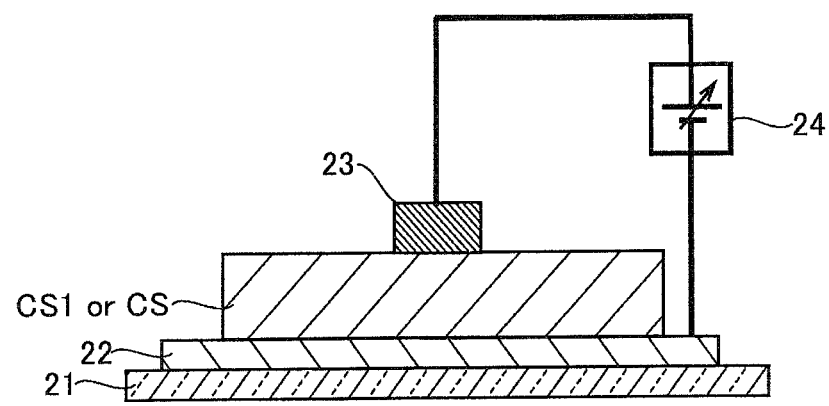
FIG. 5 shows a cross-sectional view showing a measuring method of withstand voltage in the vertical direction in the first embodiment of the present invention.

FIG. 5 shows a cross-sectional view showing a measuring method of withstand voltage in the vertical direction in the first embodiment of the present invention.

Referring to FIGS. 4 and 5, a sample to be measured (compound semiconductor substrate CS1) was fixed on copper plate 22 pasted on glass plate 21. On the Al nitride semiconductor layer 7 of the fixed sample, electrode 23 made of Al was provided to contact the Al nitride semiconductor layer 7. One terminal of curve tracer 24 is connected to copper plate 22, the other terminal is connected to electrode 23. Using curve tracer 24, a voltage was applied between copper plate 22 and electrode 23. The current flowing between copper plate 22 and electrode 23 (current flowing vertically through the sample) was measured. When the measured current reaches $1A/cm^2$, it is considered that the sample was broken down, and the voltage between copper plate 22 and electrode 23 at this time was measured as withstand voltage.

As a result, the vertical withstand voltage of sample 2 in which AlN layer AL was formed at a constant temperature, was 501V. On the other hand, withstand voltages of sample 4 and sample 6 in which AlN layer AL was formed at two temperatures was 709V and 763V, respectively, which were higher than withstand voltage of sample 2. Moreover, withstand voltages of the samples 1 and 3 in which only a Si substrate was used as substrate SB was 642V and 650V, respectively. The withstand voltages of samples 4 and 6 were higher than the withstand voltage of samples 1 and 3.

Second Embodiment

The inventors of the present invention produced each of the samples 1 to 15 under different conditions, and the vertical withstand voltage of each of the samples 11 to 15 was measured.

FIG. 6 shows a table showing the relationship between the preparation conditions of each of the samples 11 to 15 and the measured vertical withstand voltages in the second embodiment of the present invention.

Referring to FIG. 6, the preparation conditions of each of the samples 11 to 15 are as follows.

Sample 11 (example of the present invention): In compound semiconductor substrate CS shown in FIG. 1, at the film forming temperature of 900 degrees Celsius, an LT-AlN layer was formed. A HT-AlN layer was formed at the film forming temperature of 1200 degrees Celsius on the LT-AlN layer. The layers other than these were formed by the method described in the above embodiment.

Sample 12 (example of the present invention): In compound semiconductor substrate CS shown in FIG. 1, at the film forming temperature of 850 degrees Celsius, an LT-AlN layer was formed. A HT-AlN layer was formed at the film forming temperature of 1200 degrees Celsius on the LT-AlN layer. The layers other than these were formed by the method described in the above embodiment.

Sample 13 (example of the present invention): In compound semiconductor substrate CS shown in FIG. 1, at the film forming temperature of 800 degrees Celsius, an LT-AlN layer was formed. A HT-AlN layer was formed at the film forming temperature of 1200 degrees Celsius on the LT-AlN layer. The layers other than these were formed by the method described in the above embodiment.

Sample 14 (example of the present invention): In compound semiconductor substrate CS shown in FIG. 1, at the film forming temperature of 750 degrees Celsius, an LT-AlN layer was formed. A HT-AlN layer was formed at the film forming temperature of 1200 degrees Celsius on the LT-AlN layer. The layers other than these were formed by the method described in the above embodiment.

Sample 15 (example of the present invention): In compound semiconductor substrate CS shown in FIG. 1, at the film forming temperature of 700 degrees Celsius, an LT-AlN layer was formed. A HT-AlN layer was formed at the film forming temperature of 1200 degrees Celsius on the LT-AlN layer. The layers other than these were formed by the method described in the above embodiment.

The inventors of the present application measured withstand voltage in the vertical direction of each of the prepared samples 11 to 15, using a method similar to the measuring method shown in FIG. 5. Specifically, the current flowing between copper plate 22 and electrode 23 (current flowing vertically through the sample) is measured. Leakage current is considered to have flowed when the measured current reaches $1*10^{-4}$ A/cm$^2$, and the voltage between copper plate 22 and electrode 23 at this time was measured as withstand voltage.

As a result, withstand voltages of the samples 14 and 15 in which the film forming temperature of the LT-AlN layer is less than 800 degrees Celsius, were 317V and 24V, respectively. On the contrary, withstand voltages of Samples 11 to 13 in which the film forming temperature of the LT-AlN layer is 800 degrees Celsius or more and 900 degrees Celsius or less were 371V, 399V, and 450V, respectively. These were higher than the withstand voltages of samples 14 and 15.

Third Embodiment

The inventors of the present invention produced each of the samples 21 to 25 under different conditions, and the capacity recovery characteristics of each of the samples 11 to 15 were measured.

FIG. 7 shows a table showing preparation conditions of each of the samples 21 to 25 in the third embodiment of the present invention.

Referring to FIG. 7, the preparation conditions of each of the samples 21 to 25 are as follows.

Sample 21 (example of the present invention): In compound semiconductor substrate CS1 shown in FIG. 3, the one with a SiC layer formed on a Si substrate was used as substrate SB. On substrate SB, at the film forming temperature of 800 degrees Celsius, a LT-AlN layer was formed as AlN layer AL. At the film forming temperature of 1200 degrees Celsius, a HT-AlN layer was formed on the LT-AlN layer. At the lower part of GaN layer 6, a C-GaN layer with an average concentration of C of $1*10^{19}$ atoms/cm$^3$ was formed. The layers other than these were formed by the method described in the above embodiment.

Sample 22 (comparative example): In compound semiconductor substrate CS1 shown in FIG. 3, the one with a SiC layer formed on a Si substrate was used as substrate SB. On substrate SB, at the film forming temperature of 1100 degrees Celsius, a LT-AlN layer was formed as AlN layer AL. At the film forming temperature of 1200 degrees Celsius, a HT-AlN layer was formed on the LT-AlN layer. At the lower part of GaN layer 6, a C-GaN layer with an average concentration of C of $1*10^{19}$ atoms/cm$^3$ was formed. The layers other than these were formed by the method described in the above embodiment.

Sample 23 (comparative example): In compound semiconductor substrate CS1 shown in FIG. 3, a Si substrate was used as substrate SB. A SiC layer was not formed. At the film forming temperature of 1100 degrees Celsius, on substrate SB, a LT-AlN layer was formed as AlN layer AL. At the film forming temperature of 1200 degrees Celsius, a HT-AlN layer was formed on the LT-AlN layer. At the lower part of GaN layer 6, a C-GaN layer with an average concentration of C of $1*10^{19}$ atoms/cm$^3$ was formed. The layers other than these were formed by the method described in the above embodiment.

Sample 24 (comparative example): In compound semiconductor substrate CS1 shown in FIG. 3, the one with a SiC layer formed on a Si substrate was used as substrate SB. On substrate SB, at the film forming temperature of 1100 degrees Celsius, a LT-AlN layer was formed as AlN layer AL. At the film forming temperature of 1200 degrees Celsius, a HT-AlN layer was formed on the LT-AlN layer. At the lower part of GaN layer 6, a C-GaN layer with an average concentration of C of $1*10^{18}$ atoms/cm$^3$ was formed. The layers other than these were formed by the method described in the above embodiment.

Sample 25 (comparative example): In compound semiconductor substrate CS1 shown in FIG. 3, a Si substrate was used as substrate SB. A SiC layer was not formed. On substrate SB, at the film forming temperature of 1100 degrees Celsius, a LT-AlN layer was formed as AlN layer AL. At the film forming temperature of 1200 degrees Celsius, a HT-AlN layer was formed on the LT-AlN layer. At the lower part of GaN layer 6, a C-GaN layer with an average concentration of C of $1*10^{18}$ atoms/cm$^3$ was formed. The layers other than these were formed by the method described in the above embodiment.

The inventors of the present invention measured capacity recovery characteristics of each of the prepared samples 21 to 24 by the following method.

Figure 8:
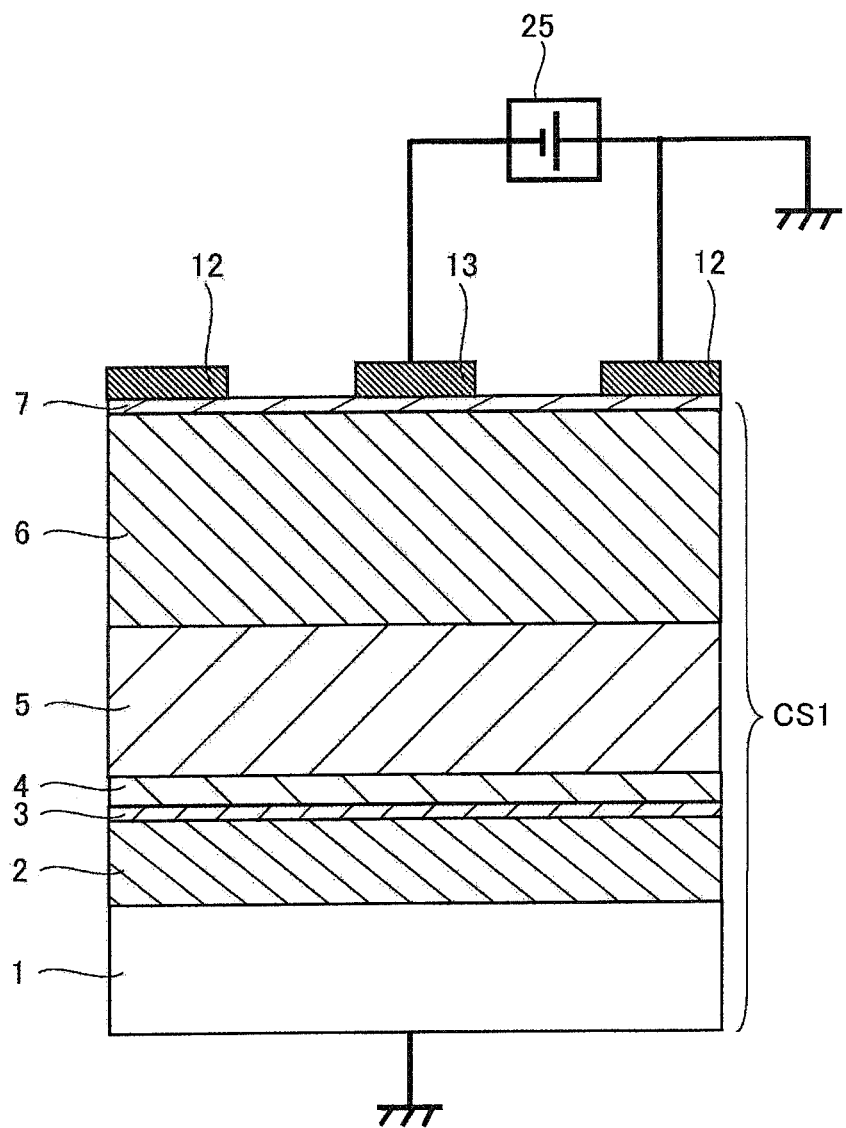
FIG. 8 shows a cross-sectional view showing a method of measuring capacitance in the third embodiment of the present invention.

FIG. 8 is a cross-sectional view showing a method of measuring capacitance in the third embodiment of the present invention.

Referring to FIG. 8, on Al nitride semiconductor layer 7 of a sample (compound semiconductor substrate CS1) to be measured, each of electrode 12 and electrode 13 was provided being spaced apart from one another, to contact Al nitride semiconductor layer 7. By this, a HEMT was fabricated. When viewed from the upper side in FIG. 8, electrode 12 was formed in a ring shape so as to surround electrode 13. Next, the plus terminal of the measuring device 25 was connected to electrode 13, and the minus terminal was connected to electrode 12. The electrode 12 and the reverse side (the lower surface in FIG. 8) of the Si substrate 1 were grounded. Next, with the measuring device 25 used, capacitance (equivalent to capacitance before voltage application) between electrode 13 and electrode 12 was measured. Next, with the measuring device 25 used, after a voltage of −30V (voltage based on the potential of electrode 12) was applied for 60 seconds between electrode 13 and electrode 12, the application of voltage was stopped. With measuring device 25 used, from the time when the voltage application was stopped, the time change of capacitance (corresponding to capacitance after voltage application) between electrode 13 and electrode 12 was measured.

Figure 9:
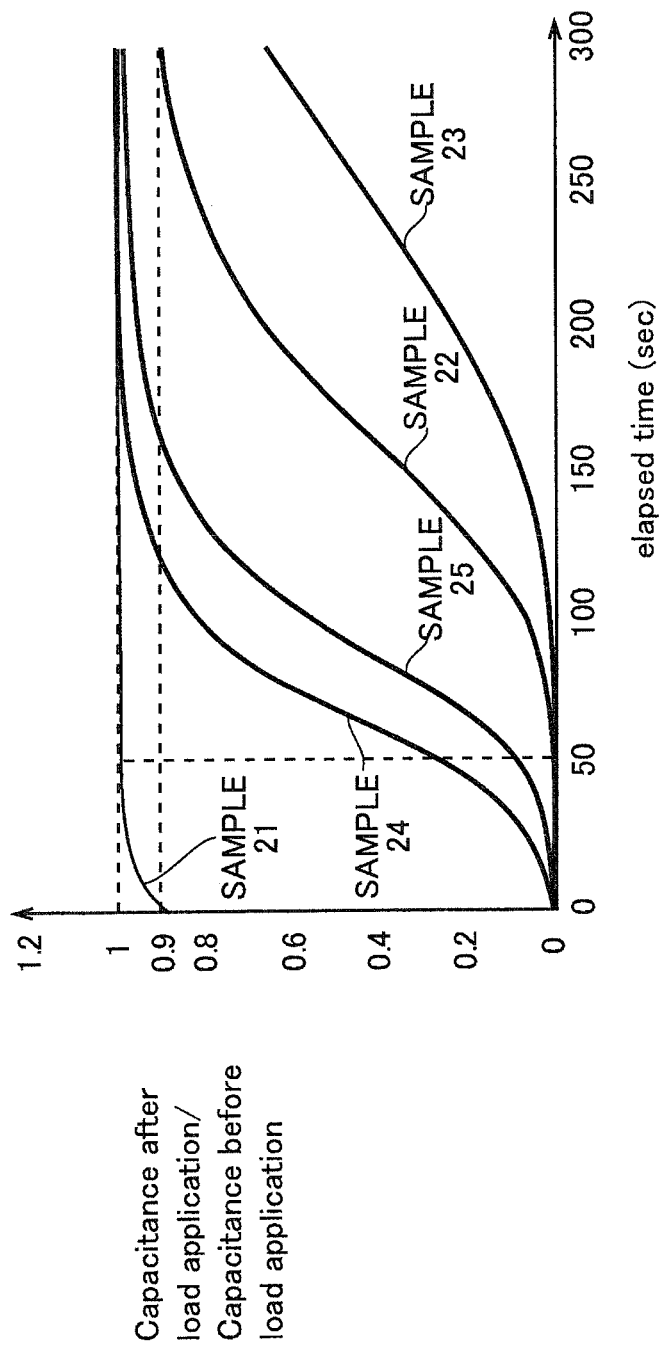
FIG. 9 shows a graph showing the relationship between the ratio of capacitance after voltage application to capacitance before the voltage application and the elapsed time, in the third embodiment of the present invention.

FIG. 9 shows a graph showing the relationship between the ratio of capacitance after voltage application to capacitance before the voltage application and elapsed time, in the third embodiment of the present invention. In the graph of FIG. 9, the elapsed time from the time when the application of the voltage was stopped is shown.

Referring to FIG. 9, when a negative voltage is applied between electrode 13 and electrode 12, electrons in GaN layer 6 is moved away from electrode 13. At this time, if a site that traps electrons (a kind of defect) exists in GaN layer 6, part of the electrons is trapped at this site. Even after the application of the negative voltage is stopped, the trapped electrons continue to be trapped at this site and are not be able to move freely. Thus, a GaN layer in devices with large current collapse contains many sites that trap electrons. Thus, a lot of electrons is trapped at this site by the application of a negative voltage, so that it takes time to recover capacitance between electrode 13 and electrode 12 after the negative voltage application is stopped. Measurement of this capacitance recovery is an indicator of the current collapse characteristic. It can be said that the characteristic is good enough when capacitance recovers in a short time.

The time for the ratio of capacitance after voltage application to capacitance before the voltage application to recover to 0.9 or more was about 5 seconds in sample 21. This time to recovery is within the time of the voltage application and within 85% of the time of the voltage application. On the other hand, according to the sample 24, the time is about 100 seconds. For sample 25, the time is about 150 seconds. The time for sample 22 and sample 23 is 300 seconds or more. These were all greater than the time of the voltage application. Therefore, it was found that current collapse was reduced in sample 21.

Fourth Embodiment

The inventors of the present invention made each of the samples 31 to 33 (all is of the present invention) having different thicknesses of the LT-AlN layer. The vertical withstand voltage and the warpage were measured. It was checked whether cracks occurred or not. The vertical withstand voltage was measured by the method shown in FIG. 5.

The preparation conditions of each of the samples 31 to 33 are as follows. In compound semiconductor substrate CS shown in FIG. 1, at the film forming temperature of 800 degrees Celsius, an LT-AlN layer was formed. At the film forming temperature of 1200 degrees Celsius, a HT-AlN layer was formed on the LT-AlN layer. The thickness of the LT-AlN layer of sample 31 was 15 nanometers. The thickness of the LT-AlN layer of sample 32 was 30 nanometers. The thickness of the LT-AlN layer of sample 33 was 60 nanometers. The layers other than these were formed by the method described in the above embodiment.

The vertical withstand voltages of samples 31 to 33 was measured. As a result, vertical withstand voltages of 708V, 780V, and 688V were obtained respectively. Also, warpage is small in any of the samples 31 to 3:3. As the thickness of the LT-AlN layer decreased, warpage decreased. Furthermore, in samples 31 and 32, no occurrence of crack was observed. However, slight occurrence of crack was observed in sample 33.

Other

The embodiments and examples described above should be considered as illustrative in all points and not restrictive. The scope of the present invention is shown not by the above description but by the scope of claims, and is intended to include all modifications within the scope and meaning equivalent to the scope of claims.

EXPLANATION OF REFERENCE NUMERALS

1: Si (silicon) substrate
2: SiC (silicon carbide) layer
3: LT (Low Temperature)-AlN (aluminum nitride) layer
3a: nucleus of AlN
4: HT (High Temperature)-AlN layer
5,7: Al (Aluminum) nitride semiconductor layer
6: GaN (gallium nitride) layer
12, 13, 23: electrode
21: glass plate
22: copper plate
24: curve tracer
25: measuring equipment
61: C (carbon)-GaN layer
62: u (undoped)-GaN layer
AL: AlN layer
CS, CS1: compound semiconductor substrate
SB: substrate

What is claimed is:

1. A method for manufacturing a compound semiconductor substrate comprising
a step to form a SiC layer on a Si substrate,
a step to form a first AlN layer made of a single crystal having a thickness of 12 nanometers or more and 100 nanometers or less on the SiC layer at 700 degrees Celsius or more and 1000 degrees Celsius or less,
a step to form a second AlN layer made of a single crystal on the first AlN layer at a temperature higher than the temperature at which the first AlN layer was formed, the second AlN layer being in contact with the first AlN layer,
a step to form a first nitride semiconductor layer containing Al on the second AlN layer,
a step to form a GaN layer on the first nitride semiconductor layer,
a step to form a second nitride semiconductor layer containing Al on the GaN layer, and
a step to separate the GaN layer into a C-doped C-GaN layer and a C-undoped u-GaN layer which is formed on the C-GaN layer and in contact with the C-GaN layer by doping with C into a part of the GaN layer, the u-GaN layer is a layer where a channel is formed,
wherein the first AlN layer is formed at a temperature of 800 degrees Celsius or more and 850 degrees Celsius or less in the step to form the first AlN layer.

2. The method for manufacturing a compound semiconductor substrate according to claim 1, wherein
the second AlN layer is formed at a temperature of 1000 degrees Celsius or more and 1500 degrees Celsius or less, in the step to form the second AlN layer.

3. The method for manufacturing a compound semiconductor substrate according to claim 1, wherein
the second AlN layer is formed with a thickness of 50 nanometers or more and 1000 nanometers or less, in the step to form the second AlN layer.

4. A compound semiconductor substrate manufactured by the method according to claim 1, comprising
a Si substrate,
a SiC layer, formed on the Si substrate,
an AlN layer, formed on the SiC layer,
a first nitride semiconductor layer including Al, formed on the AlN layer,
a GaN layer, formed on the first nitride semiconductor layer, and
a second nitride semiconductor layer including Al, formed on the GaN layer,
wherein the GaN layer includes a C-GaN layer and a C-undoped u-GaN layer which is formed on the C-GaN layer and in contact with the C-GaN layer, and wherein the second nitride semiconductor layer is in contact with the first nitride semiconductor layer, time until a ratio of capacitance between a first electrode and a second electrode after application of voltage to capacitance between the first electrode and the second electrode before the application of the voltage recovers to 0.9 or more after the application of voltage was stopped is within 85% of time the voltage had been applied, when voltage of −30V had been applied for 60 seconds between the first electrode and the second electrode and the application of the voltage was stopped, wherein the first electrode is provided on the second nitride semiconductor layer and is in contact with the second nitride semiconductor layer, and the second electrode is provided on the second nitride semiconductor layer and is in contact with the second nitride semiconductor layer so as to surround the first electrode.

* * * * *